US005155748A

United States Patent [19]

Rabii

[11] Patent Number: 5,155,748

[45] Date of Patent: Oct. 13, 1992

[54] PROGRAMMABLE MULTI-SOURCE IR DETECTOR

[75] Inventor: Khosro M. Rabii, Arlington Heights, Ill.

[73] Assignee: Zenith Electronics Corporation, Glenview, Ill.

[21] Appl. No.: 680,499

[22] Filed: Apr. 4, 1991

[51] Int. Cl.[5] ..................... H03K 21/08; G06M 3/08; G11C 16/02

[52] U.S. Cl. ....................................... 377/54; 377/39; 377/56; 377/52

[58] Field of Search ....................... 377/39, 54, 56, 54; 328/119

[56] References Cited

U.S. PATENT DOCUMENTS

| | | | |
|---|---|---|---|
| 3,869,083 | 3/1975 | Malmon | 377/54 |
| 3,894,287 | 7/1975 | Mathiesen | 328/119 |
| 3,938,146 | 2/1976 | Dano | 328/119 |
| 4,034,156 | 7/1977 | Willmore | 377/54 |
| 4,232,267 | 11/1980 | Hanajima et al. | 328/119 |
| 5,022,059 | 6/1991 | Arai | 377/39 |
| 5,060,244 | 10/1991 | Robertson | 377/56 |

*Primary Examiner*—John S. Heyman

[57] ABSTRACT

A programmable circuit for sampling an IR signal is responsive to a clock signal and a plurality of programmable factors which establish the characteristics of the sampling pattern. The circuit provides successive groups of samples whose resolution, phase and periodicity are established by the programmable factors such that IR signals characterized by different formats may be conveniently accommodated by the same hardware.

12 Claims, 2 Drawing Sheets

PROGRAMMABLE MULTI-SOURCE IR DETECTOR

BACKGROUND OF THE INVENTION

The present invention relates generally to infra-red (IR) detectors and particularly concerns a programmable IR detector capable of being used to detect IR signals encoded in numerous different formats.

Many consumer electronics products are operated under the control of IR signals received from a hand-held transmitter. In the transmitter, a control signal is encoded according to a format selected by a particular manufacturer, the encoded control signal being used to modulate a carrier, typically about 40 $KH_z$, for subsequent transmission as a beam of IR energy. Numerous encoding formats can be employed, such as pulse width modulation in which case a logical "1" bit may be represented by a relatively wide pulse and a logical "0" bit by a relatively narrow pulse. By forming a sequence of data bits in this manner, a control word is formulated representing a selected function of the controlled device. The received signal is initially demodulated to remove the carrier signal, applied to an IR detector and then decoded to activate the selected function.

Due to the fact that the transmitted IR signals are encoded differently by different manufacturers, the IR detection circuits tend also to be unique, being specifically configured according to the encoding format employed. Thus, a given detector circuit is typically suitable for processing only the demodulated IR signals received from the transmitter of a single manufacturer. Such dedicated detection circuits are uneconomical since they are not adaptable for widespread use in receivers from different manufacturers.

It is therefore a basic object of the present invention to provide an economical IR detection circuit capable of use in receivers from diverse manufacturers.

It is a further object of the invention to provide an IR detection circuit which may be programmed for detecting IR signals encoded in different formats.

It is yet another object of the invention to provide an IR detection circuit which may be programmed for precise detection of an encoded IR signal.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
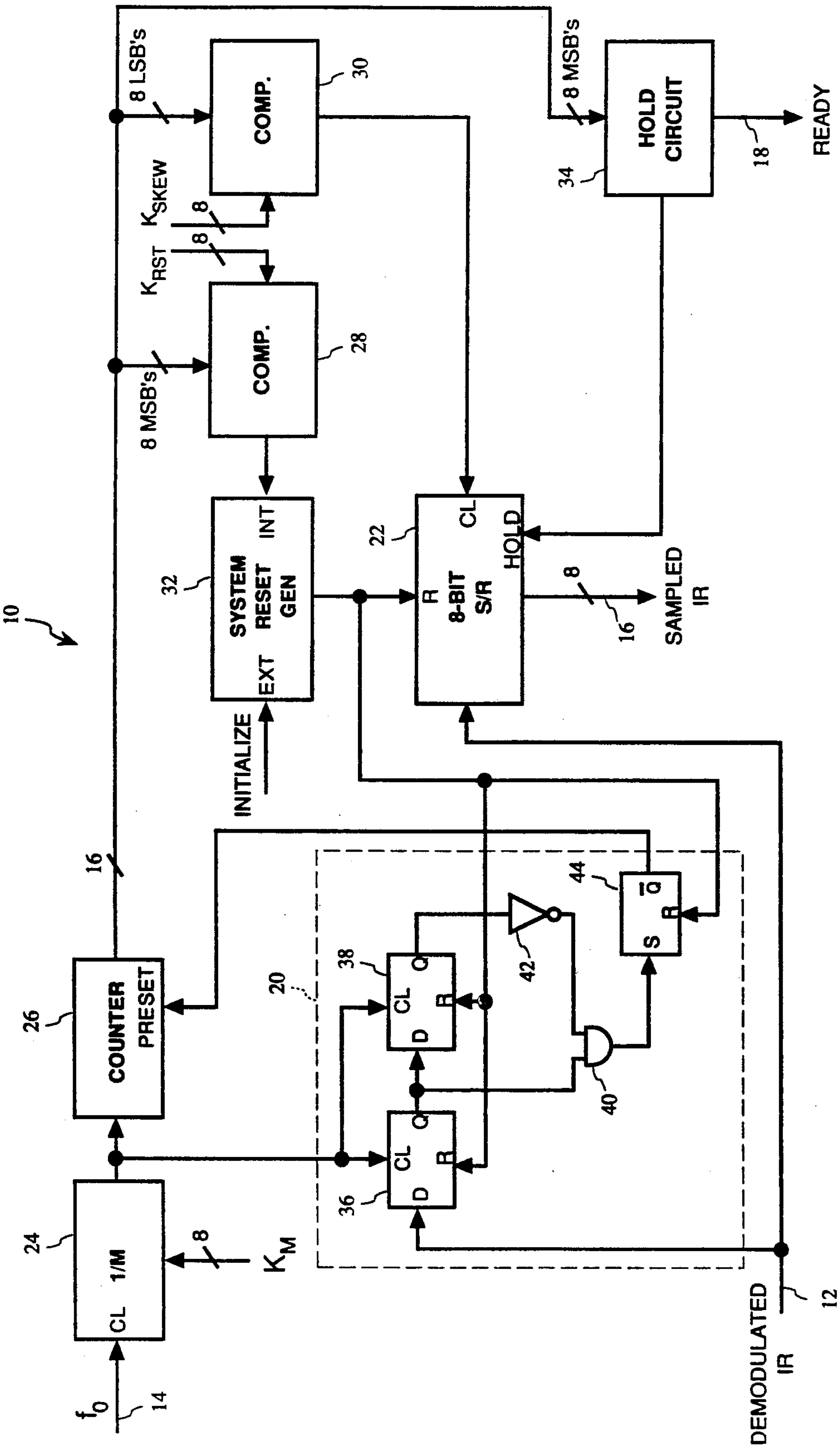
FIG. 1 is a block diagram of a programmable multi-source IR detection circuit constructed in accordance with the invention.

Referring to FIG. 1, an IR detection circuit constructed according to the invention is generally designated by reference numeral 10. Detection circuit 10 includes a first input 12 for receiving a demodulated IR signal, which may be encoded in any one of numerous different formats, a second input 14 for receiving a system clock fo, which may comprise for example 4 $MH_z$, a first output 16 comprising an 8-bit sample of a period of the encoded IR signal and a second output 18 comprising a signal representing that the 8-bit signal at output 16 is ready to be processed.

The demodulated IR signal at input 12 is applied to the input of a rising edge detector and hold circuit 20 and to the input of an 8-bit shift register 22 providing the 8-bit output sample 16. The system clock fo is supplied to the input of a programmable divider 24 which also receives at a second input an 8-bit programmable divisor Km. The output of divider 24 is therefore a clock signal fo/Km which is programmable in 256 equal steps between a maximum frequency of 4.0 $MH_z$ and a minimum frequency of 15.625 $KH_z$. Clock signal fo/Km is supplied to the clock input of a 16-stage binary counter 26 and to a second input of edge detection circuit 20. Counter 26 provides a 16-bit output, the 8 most significant bits of which are coupled to a first comparator 28 and the 8 least significant bits of which are coupled to a second comparator 30. Comparator 28 also receives an 8-bit programmable constant Krst representing a system reset variable and provide an output to the internal reset input of a system reset generator 32. Comparator 30 receives a second 8-bit input comprising a programmable constant Kskew representing a skew or sampling phase variable and provides an output to the clock input of shift register 22.

System reset generator 32, which also includes an external reset input supplied with an initialize signal, provides an output reset signal for resetting edge detection circuit 20 and shift register 22. The 8 most significant bits of the output of counter 26 are also supplied to a hold circuit 34 which provides the aforementioned output 18 and also supplies an output to the hold input of shift register 22. In particular, the two outputs of hold circuit 34 go high whenever the value represented by the 8 most significant bits of counter 16 is equal to or exceeds 8, and are otherwise low.

Edge detection circuit 20 comprises a pair of D-type flip-flops 36 and 38 each receiving clock signal fo/Km and each being reset in response to the output of reset generator 32. The demodulated IR signal from input 12 is coupled to the D-input of flip-flop 36, whose Q output supplies the D-input of flip-flop 38 and one input of an AND gate 40. The Q output of flip-flop 38 is applied through an inverter 42 to the second input of AND gate 40, the output of which is applied to the S-input of an R/S flip-flop 44. Flip-flop 44 also receives a reset signal at its R-input from reset generator 32 and has its $\overline{Q}$ output coupled to the Preset input of counter 26.

In operation, detection circuit 10 is initialized by applying an Initialize signal to the external reset input of system reset generator 32 whereby an output is produced resetting flip-flops 36, 38 and 44 of detection circuit 20 and shift register 22. The high $\overline{Q}$ output of flip-flop 44 also maintains counter 26 in a preset condition, in which all of its 16 outputs are preferably held in a logical "1" state. Thereafter, the Q output of flip-flop 36 is clocked to a high state in response to the first clock pulse fo/Km following a transition of the demodulated IR signal from a low state to a high state. The output of AND gate 40 therefore goes high setting flip-flop 44, whose $\overline{Q}$ output goes low thereby enabling counter 26. Counter 26 consequently begins counting clock signal fo/Km. Assuming that programmable constant Kskew is set to a value of "0", it may be set to any value between "0" and "255", comparator 30 provides an output clocking shift register 22 in response to the first clock pulse counted by counter 26. Shift register 22 thereby takes a first sample of the demodulated IR signal shortly after its first transition from a low state to a high state.

Subsequently, each time the 8 least significant bits of counter 26 complete a full counting cycle, comparator 30 generates another output clocking shift register 22. Thus, shift register 22 will take successive periodic samples of the demodulated IR signal at a rate equal to fo/256*Km. Hold circuit 34 applies a signal to the hold input of shift register 22 after 8 samples have been stored and also generates the Ready signal on output 18. The first 8 samples of the IR signal are thereby fixed in shift register 22 and may be read for processing by external circuitry (not shown) as indicated by the Ready signal.

While the contents of shift register 22 have been effectively frozen, counter 26 continues to count clock signal fo/Km. When the count reflected by the 8 most significant bits equals Krst, comparator 28 develops an output signal causing reset generator 32 to reset edge detector 20 and shift register 22, thereby defining one complete sampling cycle of detection circuit 10. Thereafter, additional sampling cycles are effected in the manner described above.

In accordance with the foregoing, it will be appreciated that detection circuit 10 is operable for effecting successive sampling cycles of the demodulated IR signal, each cycle having a duration defined by programmable constant Krst and comprising 8 binary samples produced at a rate determined by programmable divisor Km and beginning shortly after the first positive going transition of the IR signal during each sampling cycle. Moreover, the phase of the samples relative to the IR signal may be varied by appropriately setting programmable constant Kskew.

An example of the foregoing operation is illustrated in connection with the waveform of FIG. 2. There is depicted in this Figure a demodulated IR signal 50 comprising a successive series of 5.6 ms data bit intervals. Each 5.6 ms data bit interval includes an initial 0.5 ms pulse followed 0.5 ms later by a second 0.5 ms pulse representing a logic "1" bit (as in the first and third data bit intervals) or followed 0.5 ms later by the absence of a second pulse representing a logic "0" bit (as in the case of the second data bit interval). Arrows A–H in each data bit interval represent 8 desired sampling points selected for distinguishing a logic "1" bit from a logic "0" bit. It will be observed that the 8 sampling points are packed relatively closely near the beginning of each 5.6 ms interval where the information pulses are expected to occur. No sampling points are selected slightly beyond the expected occurrence of the second pulses to improve the noise performance of the system. Accordingly, it will be understood that, considering the selected sampling pattern, each data bit interval resulting in a sampling pattern of 11001100 will be interpreted as a logic "1" bit and each data bit interval resulting in a sampling pattern of 11000000 will be interpreted as a logic "0" bit.

Figure 2:
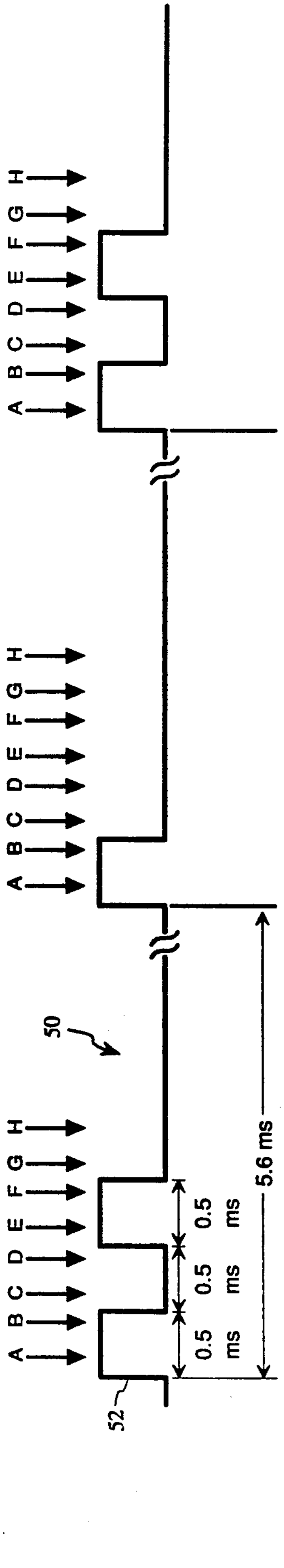
FIG. 2 is an exemplary demodulated IR waveform useful in explaining the operation of the circuit of FIG. 1.

Referring back to FIG. 1, the selected sampling pattern illustrated in FIG. 2 is effected by detection circuit 10 as follows. Initially, programmable divisor Km is selected for programming divider 24 for dividing the 4.0 $MH_z$ system clock fo by a factor of 3 producing a clock signal at the output of the divider having a frequency of 1.33 $MH_z$. This clock frequency will provide periodic clock pulses at the output of comparator 30 at a rate of about 192 microseconds which is close to the desired sampling interval of samples A–H. Next, programmable constants Krst and Kskew are selected. Constant Krst is selected to have a value of 29 (5.6 ms/192 microseconds) for resetting detection circuit 10 at the end of each 5.6 ms data bit interval and constant Kskew is selected to have a value of 77 for phase shifting samples A–H such that the samples divide each pulse of the IR signal into three substantially equal parts.

In operation, and as previously explained, circuits 20 and 22 are initially reset in response to an Initialize signal applied to system reset generator 32. Thereafter, in response to the first 1.33 $MH_z$ clock signal after pulse 52 goes high, edge detection circuit 20 enables counter 26 which begins counting the 1.33 $MH_z$ clock signal. The first sample A of IR signal 50 is then taken when the 8 least significant bits of the output of the counter equals Kskew. This will occur about 192 microseconds after the rising edge of pulse 52 and cause a logic 1 bit to be read into shift register 22. Seven further samples B–H spaced 192 microseconds apart are subsequently read into the shift register in response to comparator 30 detecting subsequent equality conditions between the 8 least significant bits of the output of counter 26 and Kskew. After the 8 bits (11001100) are loaded into shift register 22, a hold signal is generated by hold circuit 34 freezing the contents of the register. The Ready signal, generated by hold circuit 34 substantially simultaneously with the hold signal, indicates that the contents of shift register 22 are ready to be processed. Finally, comparator 28 develops an output near the end of the 5.6 ms data bit interval when the 8 most significant bits of the counter output equal Krst causing reset generator 32 to reset the detection circuit. The next and subsequent 5.6 ms data bit intervals are successively sampled in a like manner providing successive 8-bit samples of the form 11000000 which are interpreted as a logic "0" or 11001100 which are interpreted as a logic "1".

As discussed previously, the demodulated IR signal may take numerous forms other than the example shown in FIG. 2. According to the invention, by appropriately selecting the programmable factors Km, Krst and Kskew, the 8-bit sampling pattern A–H may be specifically tailored to match the particular IR signal in use. Thus, the resolution of the samples A–H may be controlled through selection of programmable divisor Km, the phasing of the samples through selection of programmable constant Kskew and the period of the samples through selection of programmable constant Krst. In this manner, the detection circuit 10 may be used to detect IR signals having numerous different formats by appropriately programming Km, Kskew and Krst.

What has been described is a novel IR detection circuit programmable for use with numerous different IR signal formats. It is recognized that numerous changes in the described embodiment of the invention will be apparent to those skilled in the art without departing from its true spirit and scope. The invention is to be limited only as defined in the claims.

I claim:

1. A programmable circuit for sampling an input signal having a predetermined format, comprising:

means for generating a clock signal;

register means operable for providing a plurality of periodic multibit samples of said input signal; and programmable control means responsive to said clock signal, said input signal and a plurality of programmable factors for operating said register means for providing said plurality of periodic multibit samples in accordance with the format of said input signal.

2. The circuit of claim 1 wherein the values of said plurality of programmable factors are respectively selected for controlling the resolution, phase and periodicity of said multibit samples provided by said register means.

3. The circuit of claim 1 wherein said control means comprises:

sensing means for generating a control signal in response to the first occurrences of a selected transition of said input signal;

counting means enabled in response to said control signal for counting said clock signal; and first programmable means responsive to said counting means and a first one of said plurality of programmable factors for operating said register means for providing said multibit samples at a sampling rate related to the frequency of said clock signal and at a phase determined in accordance with said first programmable factor.

4. The circuit of claim 3 wherein said control means comprises second programmable means responsive to said counting means and a second one of said plurality of programmable factors for resetting said sensing means and said register means at a periodic rate determined in accordance with second programmable factor.

5. The circuit of claim 4 including means for generating a system clock signal and wherein said control means comprises third programmable means responsive to a third one of said plurality of programmable factors for dividing said system clock signal for generating said clock signal.

6. The circuit of claim 4 wherein said counting means provides an output comprising a plurality of least significant bits and a plurality of most significant bits and wherein said first programmable means comprises a first comparator means clocking said register means for sampling said input signal in response to detection of a predetermined relationship between said least significant bits and said first programmable factor.

7. The circuit of claim 6 wherein said second programmable means comprises a second comparator means for resetting said register means and said sensing means in response to detection of a predetermined relationship between said most significant bits and said second programmable factor.

8. The circuit of claim 6 including hold means for applying a hold signal to said register means in response to said most significant bits representing a value equal to or greater than a predetermined value.

9. A programmable circuit for sampling an information signal, comprising:

means for generating a system clock signal having a predetermined frequency;

programmable divider means dividing said system clock signal by a first programmable factor for providing an output clock signal;

sensing means for generating a control signal in response to the first occurrence of a selected transition of said information signal;

counting means enabled in response to said control signal for counting said output clock signal;

register means operable for storing a plurality of samples of said information signal;

first control means responsive to said counting means for operating said register means for storing a plurality of samples of said information signal at a sampling rate related to said output clock signal and at a phase determined in accordance with a second programmable factor; and second control means responsive to said counting means for resetting said sensing means and said register means at a periodic rate determined in accordance with a third programmable factor, whereby said register means is operated at said periodic rate for storing respective pluralities of samples of said information signal.

10. The circuit of claim 9 wherein said counting means provides an output comprising a plurality of least significant bits and a plurality of most significant bits and wherein said first control means comprises a first comparator means clocking said register means for sampling said information signal in response to detection of a predetermined relationship between said least significant bits and said second programmable factor.

11. The circuit of claim 10 wherein said first control means comprises hold means for applying a hold signal to said register means in response to said most significant bits representing a value equal to or greater than a predetermined value.

12. The circuit of claim 11 wherein said second control means comprises a second comparator means for resetting said register means and said sensing means in response to detection of a predetermined relationship between said most significant bits and said third programmable factor.

* * * * *